(12) United States Patent
Arima et al.

(10) Patent No.: US 11,915,930 B2
(45) Date of Patent: Feb. 27, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Naoko Arima, Kyoto (JP); Masaki Inaba, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 227 days.

(21) Appl. No.: 17/404,070

(22) Filed: Aug. 17, 2021

(65) Prior Publication Data

US 2022/0068646 A1    Mar. 3, 2022

(30) Foreign Application Priority Data

Aug. 31, 2020  (JP) ................. 2020-146099

(51) Int. Cl.
*H01L 21/033* (2006.01)
*H01L 21/67* (2006.01)

(52) U.S. Cl.
CPC ...... *H01L 21/0337* (2013.01); *H01L 21/6715* (2013.01); *H01L 21/67098* (2013.01)

(58) Field of Classification Search
CPC .................................................. H01L 21/00–86
See application file for complete search history.

(56) References Cited

U.S. PATENT DOCUMENTS

| | | | |
|---|---|---|---|
| 6,465,352 B1 | 10/2002 | Aoki | 438/689 |
| 2004/0016719 A1* | 1/2004 | Liaw | G03F 7/423 |
| | | | 257/E21.255 |
| 2005/0191864 A1* | 9/2005 | Nishiguchi | H01L 21/02255 |
| | | | 438/770 |
| 2007/0074747 A1 | 4/2007 | Toshima et al. | 134/201 |
| 2010/0024847 A1* | 2/2010 | Breese | H01L 21/67051 |
| | | | 134/28 |
| 2012/0157368 A1 | 6/2012 | Mizuta et al. | 510/176 |
| 2013/0143406 A1* | 6/2013 | Hsu | H01L 21/31133 |
| | | | 257/E21.252 |
| 2014/0045339 A1 | 2/2014 | Iwata et al. | 438/745 |

(Continued)

FOREIGN PATENT DOCUMENTS

| | | | |
|---|---|---|---|
| CN | 110071035 A | | 7/2019 |
| JP | H02201916 | * | 8/1990 |

(Continued)

*Primary Examiner* — Mikhail Kornakov
*Assistant Examiner* — Richard Z. Zhang
(74) *Attorney, Agent, or Firm* — OSTROLENK FABER LLP

(57) ABSTRACT

A substrate processing method is provided for removing a resist having a hardened layer from a front surface of a substrate. The substrate processing method includes a hardened-layer removing step and a wet processing step. The hardened-layer removing step includes a heating step of heating the substrate to 150° C. or more and an ozone-gas supplying step of supplying an ozone gas to the front surface of the substrate being heated by the heating step, and the hardened-layer removing step removes the hardened layer by generating an oxygen radical near the front surface of the substrate. The wet processing step removes the resist from the front surface of the substrate by supplying a processing liquid including a sulfuric acid to the front surface of the substrate after the hardened-layer removing step.

4 Claims, 10 Drawing Sheets

(56) References Cited

U.S. PATENT DOCUMENTS

| | | | |
|---|---|---|---|
| 2014/0096792 A1 | 4/2014 | Brown | 134/1.3 |
| 2015/0068557 A1* | 3/2015 | Negoro | B08B 3/10 |
| | | | 134/105 |
| 2018/0050368 A1 | 2/2018 | Harumoto et al. | |
| 2018/0071772 A1 | 3/2018 | Akizuki | |

FOREIGN PATENT DOCUMENTS

| | | | |
|---|---|---|---|
| JP | 2002-018379 A | 1/2002 |
| JP | 2016-181677 A | 10/2016 |
| JP | 2018-056182 A | 4/2018 |
| JP | 6698489 B2 | 5/2020 |
| TW | 201820401 A | 6/2018 |
| WO | WO 2011/027772 A1 | 3/2011 |

* cited by examiner

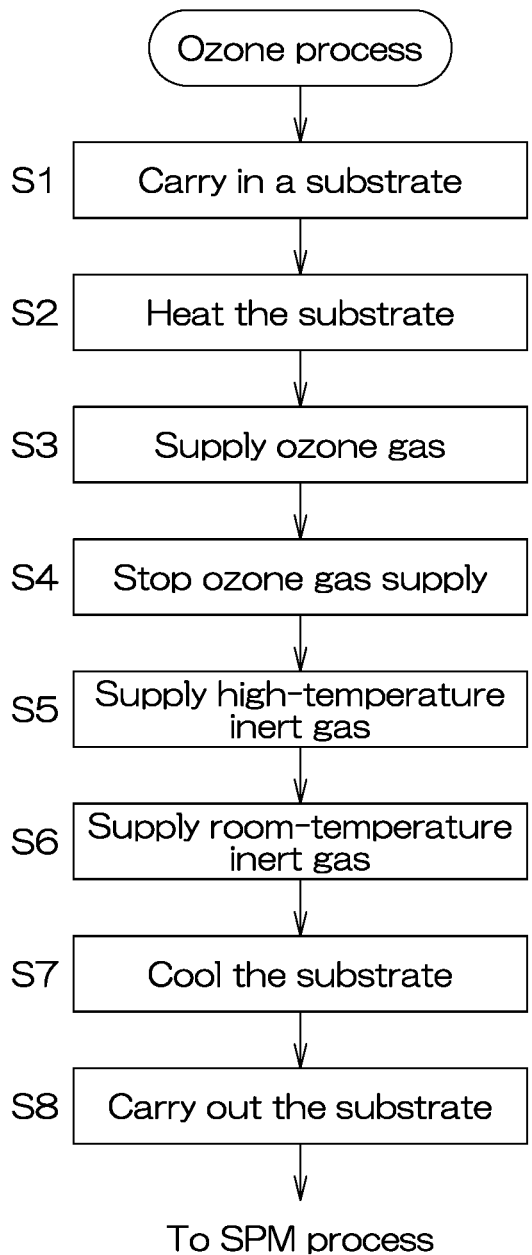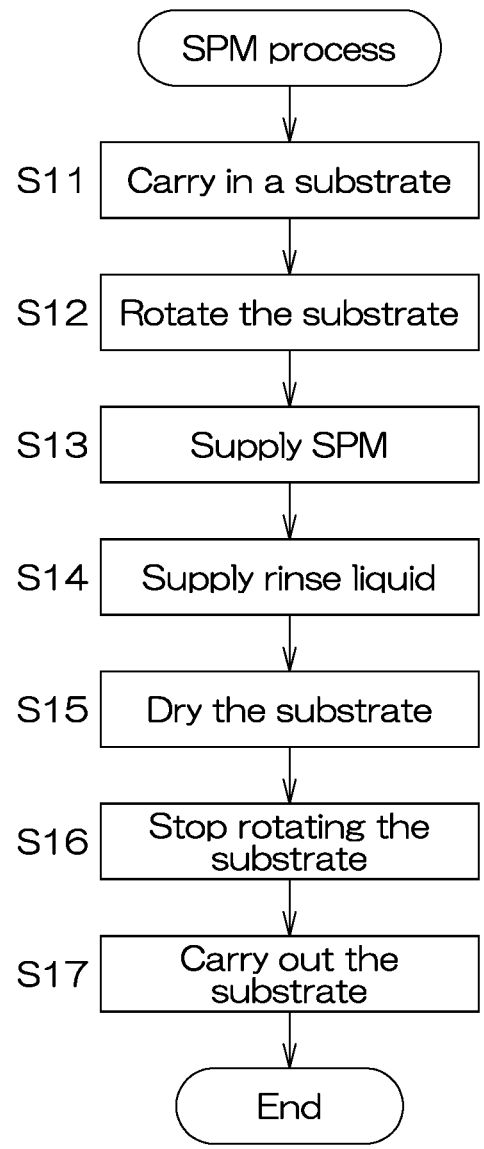

SUBSTRATE PROCESSING METHOD AND SUBSTRATE PROCESSING APPARATUS

CROSS REFERENCE TO RELATED APPLICATIONS

This application claims priority based on Japanese Patent Application No. 2020-146099 filed on Aug. 31, 2020, the entire disclosure of which is incorporated herein by reference.

BACKGROUND OF THE INVENTION

1. Field of the Invention

The present invention relates to a method and an apparatus for processing substrates. Examples of substrates to be processed include semiconductor wafers, substrates for FPDs (flat panel displays) such as liquid crystal displays or organic EL (electroluminescence) displays, substrates for optical disks, substrates for magnetic disks, substrates for magneto-optical disks, substrates for photomasks, ceramic substrates, and substrates for solar cells.

2. Description of the Related Art

A manufacturing process for manufacturing a semiconductor device includes an irradiation step of irradiating ions onto a semiconductor substrate (typically, silicon wafer). Typical examples include an ion implantation step that is performed to introduce impurity ions to a semiconductor substrate, and an ion etching step that is performed to form patterns. In these steps, a resist is pattern-formed on a front surface of the semiconductor substrate, and ions are irradiated onto the semiconductor substrate while using the resist as a mask. This makes it possible to selectively irradiate ions onto the semiconductor substrate.

Ions are also irradiated onto the resist that is used as a mask. As a result, a surface layer of the resist is carbonized and changed in quality, and a hardened layer is formed. A firmly hardened layer is formed particularly on a surface of the resist into which a high dose of ions have been implanted.

One process performed to remove a resist having a hardened layer from a front surface of a substrate is a high-temperature SPM process in which a high-temperature SPM (sulfuric acid/hydrogen peroxide mixture) is supplied to the front surface of the substrate (see Japanese Patent Application Publication No. 2016-181677).

SUMMARY OF THE INVENTION

However, the hardened layer cannot be easily removed, and therefore it is necessary to perform a high-temperature SPM process for a long time. Therefore, the amount of consumption of SPM increases. Particularly, a sulfuric acid that is a constituent liquid of SPM has a large environmental burden, and will require costs if that is neutralized, and therefore it is desirable to reduce its usage amount. Additionally, a process operation performed for a long time hinders productivity improvement, and therefore it is preferable to achieve a reduction in processing time.

Therefore, one preferred embodiment of the present invention provides a substrate processing method and a substrate processing apparatus capable of removing a resist having a hardened layer from a substrate while reducing a usage amount of a processing liquid including a sulfuric acid. Additionally, one preferred embodiment of the present invention provides a substrate processing method and a substrate processing apparatus capable of removing a resist having a hardened layer from a substrate by performing a processing operation for a short time.

One preferred embodiment of the present invention provides a substrate processing method of removing a resist having a hardened layer from a front surface of a substrate. This method includes a hardened-layer removing step of removing the hardened layer by generating an oxygen radical near the front surface of the substrate, the hardened-layer removing step including a heating step of heating the substrate to 150° C. or more and an ozone-gas supplying step of supplying an ozone gas to the front surface of the substrate being heated by the heating step (ozone processing step), and a wet processing step of removing the resist from the front surface of the substrate by supplying a processing liquid including a sulfuric acid to the front surface of the substrate after the hardened-layer removing step.

According to this method, an ozone gas is supplied to the front surface of the substrate that is heated to 150° C. or more. The ozone gas receives heat from the front surface of the substrate and is thermally decomposed, and, as a result, an oxygen radical is generated. This oxygen radical acts on the hardened layer, and, as a result, the hardened layer is removed. Thereafter, when the wet processing step is performed in which a processing liquid including a sulfuric acid is supplied to the front surface of the substrate, the processing liquid swiftly reaches a non-hardened layer of the resist, and dissolves the non-hardened layer. Therefore, it is possible to remove the resist by performing a wet process for a short time. As a result, it is possible to reduce an amount of consumption of a processing liquid including a sulfuric acid. Moreover, it is possible to remove the resist by performing the wet process for a short time, and therefore it is possible to shorten a processing time and to contribute to productivity improvement.

In the hardened-layer removing step in which the heating of the substrate and the supply of the ozone gas are concurrently performed, a portion of the hardened layer may be removed, or all of the hardened layer may be removed. Even if a portion of the hardened layer remains at a stage at which the wet process is started, a period of time required until a processing liquid including a sulfuric acid reaches the non-hardened layer of the resist and an amount of consumption of the processing liquid become smaller than in a case in which the hardened-layer removing step in which an ozone gas is supplied to the heated substrate is not performed. Preferably, in the hardened-layer removing step, the hardened layer is removed at least until a processing-liquid path that passes through the hardened layer and reaches the non-hardened layer is formed. As a result, in the wet process, the processing liquid including the sulfuric acid swiftly reaches the non-hardened layer, and therefore it is possible to lift off the hardened layer together with the non-hardened layer even if the hardened layer remains.

Preferably, the temperature of the substrate in the heating step is set at 170° C. or less in order to avoid resist popping that results from the heating of the substrate.

In one preferred embodiment of the present invention, the heating step is performed by placing the substrate on a hot plate disposed in a thermal processing chamber (preferably, a sealed chamber). The ozone-gas supplying step is performed by introducing an ozone gas into the thermal processing chamber. The substrate processing method further includes a high-temperature inert gas supplying step of introducing an inert gas having a temperature of 150° C. or more into the thermal processing chamber after finishing the hardened-layer removing step by stopping the ozone-gas supplying step.

According to this method, the substrate is placed on the hot plate disposed in the thermal processing chamber, and is heated to 150° C. or more. Further, an ozone gas is introduced into the thermal processing chamber, and, as a result, the ozone gas reaches the front surface of the substrate, and receives heat from the substrate, and is decomposed. After stopping the supply of the ozone gas to finish the hardened-layer removing step, an inert gas of 150° C. or more is introduced into the thermal processing chamber.

The temperature of the ozone gas does not reach 150° C. at a position far from the hot plate and from the substrate in the thermal processing chamber, and therefore the thermal decomposition of the ozone gas does not occur there. Ozone is harmful, and therefore it is necessary to discharge ozone from the inside of the thermal processing chamber before opening the thermal processing chamber and taking the substrate out of the chamber. However, it takes time to replace an atmosphere in the thermal processing chamber until the ozone concentration in the thermal processing chamber becomes equal to or less than an acceptable value. Therefore, in the present preferred embodiment, a high-temperature inert gas of 150° C. or more is introduced into the thermal processing chamber. As a result, ozone remaining in the thermal processing chamber is swiftly thermally decomposed. Although an oxygen radical is generated by this thermal decomposition, its lifetime is short, and therefore it is possible to resultantly vanish ozone in the thermal processing chamber in a short time. This makes it possible to shorten a time between the hardened-layer removing step and the wet processing step, hence making it possible to render productivity even higher.

In one preferred embodiment of the present invention, the substrate processing method further includes a room-temperature-inert-gas supplying step of introducing a room-temperature inert gas into the thermal processing chamber after the high-temperature inert gas supplying step.

The thermal processing chamber becomes high in temperature by heating the substrate and by supplying a high-temperature inert gas. It is possible to swiftly cool the thermal processing chamber by supplying a room-temperature inert gas thereafter and by replacing the internal atmosphere of the thermal processing chamber. This makes it possible to shorten a time required until the substrate is taken out of the thermal processing chamber. Ozone in the thermal processing chamber has been vanished by thermal decomposition caused by the supply of a high-temperature inert gas, and therefore the room-temperature inert gas is not required to be supplied for a long time.

The term "room temperature" denotes an environmental temperature at which the substrate processing method is performed, and, typically, is the temperature of the inside of a factory in which the substrate processing method is performed. The room-temperature inert gas is, in practice, an inert gas supplied from an inert gas supply source without being heated.

In one preferred embodiment of the present invention, the ozone-gas supplying step supplies an ozone gas having a temperature of less than 150° C. to the front surface of the substrate.

It is possible for an ozone gas to reach the front surface of the substrate in a not-yet-decomposed state by supplying an ozone gas of less than 150° C. Therefore, it is possible to bring about the thermal decomposition of ozone near the front surface of the substrate by means of heat emitted from the substrate and to generate an oxygen radical. This makes it possible to allow the oxygen radical to reliably act on the hardened layer of the resist, hence making it possible to perform efficient processing.

One preferred embodiment of the present invention provides a substrate processing apparatus that includes a substrate heating unit that has a thermal processing chamber housing a substrate and that is capable of heating the substrate to 150° C. or more in the thermal processing chamber, an ozone gas supply unit that supplies an ozone gas into the thermal processing chamber, and a processing liquid supply unit that supplies a processing liquid including a sulfuric acid to the substrate.

This configuration makes it possible to perform the aforementioned substrate processing method. In detail, it is possible to heat the substrate to 150° C. or more in the thermal processing chamber and to supply an ozone gas to the front surface of the substrate being heated. This makes it possible to allow ozone to bring about thermal decomposition on the front surface of the substrate, and makes it possible to generate an oxygen radical, and makes it possible to remove the hardened layer of the resist by the action of the oxygen radical. Therefore, it is possible to remove the resist in a short time through a process performed thereafter that uses the processing liquid including the sulfuric acid, and therefore it is possible to restrict an amount of consumption of the processing liquid including the sulfuric acid, and it is possible to improve productivity.

In one preferred embodiment of the present invention, the substrate processing apparatus further includes a high-temperature inert gas supply unit that supplies an inert gas having a temperature of 150° C. or more into the thermal processing chamber.

This configuration makes it possible to supply an inert gas of 150° C. or more into the thermal processing chamber after supplying ozone into the thermal processing chamber in a state in which the substrate is being heated and removing the hardened layer of the resist. This makes it possible to thermally decompose ozone remaining in the thermal processing chamber in a not-yet-decomposed state. Therefore, it is possible to swiftly reduce ozone remaining in the thermal processing chamber, and therefore it is possible to shorten a time required until the already-processed substrate is carried out of the thermal processing chamber and to improve productivity.

In one preferred embodiment of the present invention, the substrate processing apparatus further includes a room-temperature inert gas supply unit that supplies a room-temperature inert gas into the thermal processing chamber.

This configuration makes it possible to replace the internal atmosphere of the thermal processing chamber with a room-temperature inert gas, hence making it possible to facilitate the cooling of the thermal processing chamber. This makes it possible to shorten a time required until the substrate is taken out of the thermal processing chamber and to improve productivity.

In one preferred embodiment of the present invention, the ozone gas supply unit supplies an ozone gas having a temperature of less than 150° C. into the thermal processing chamber.

This configuration makes it possible for the ozone gas to reach the front surface of the substrate in a not-yet-decomposed state. The lifetime of an oxygen radical generated by the thermal decomposition of ozone is short, and therefore it is preferable to bring about the thermal decomposition of ozone near the front surface of the substrate in order to allow the oxygen radical to act on the hardened layer of the resist.

Therefore, it is possible to bring about thermal decomposition near the front surface of the substrate by supplying an ozone gas of less than 150° C., and allow an oxygen radical generated thereby to act on the hardened layer of the resist.

In one preferred embodiment of the present invention, the substrate heating unit includes a hot plate on which the substrate is placed. Without heating the entirety of the thermal processing chamber, it is possible to heat the substrate by allowing a heating operation to be performed by the hot plate. As a result, it is possible to efficiently bring about the thermal decomposition of ozone in the front surface of the substrate.

In one preferred embodiment of the present invention, the processing liquid supply unit is configured to supply a processing liquid including a sulfuric acid to the substrate in another liquid processing chamber differing from the thermal processing chamber. As thus described, the dry process (hardened-layer removing step) and the wet process are performed in different chambers, hence making it possible to efficiently process the substrate. In other words, there is no necessity to adjust an environment in a chamber in order to perform the wet process subsequently to the dry process, or there is no necessity to adjust an environment in the chamber in order to perform the dry process subsequently to the wet process.

The aforementioned or yet other objects, features, and effects of the present invention will be clarified by the following description of preferred embodiments given below with reference to the accompanying drawings.

BRIEF DESCRIPTION OF THE DRAWINGS

FIG. 8A and FIG. 8B are flowcharts each shown to describe the flow of specific substrate processing performed by the substrate processing apparatus.

DETAILED DESCRIPTION OF THE PREFERRED EMBODIMENTS

Figure 1:
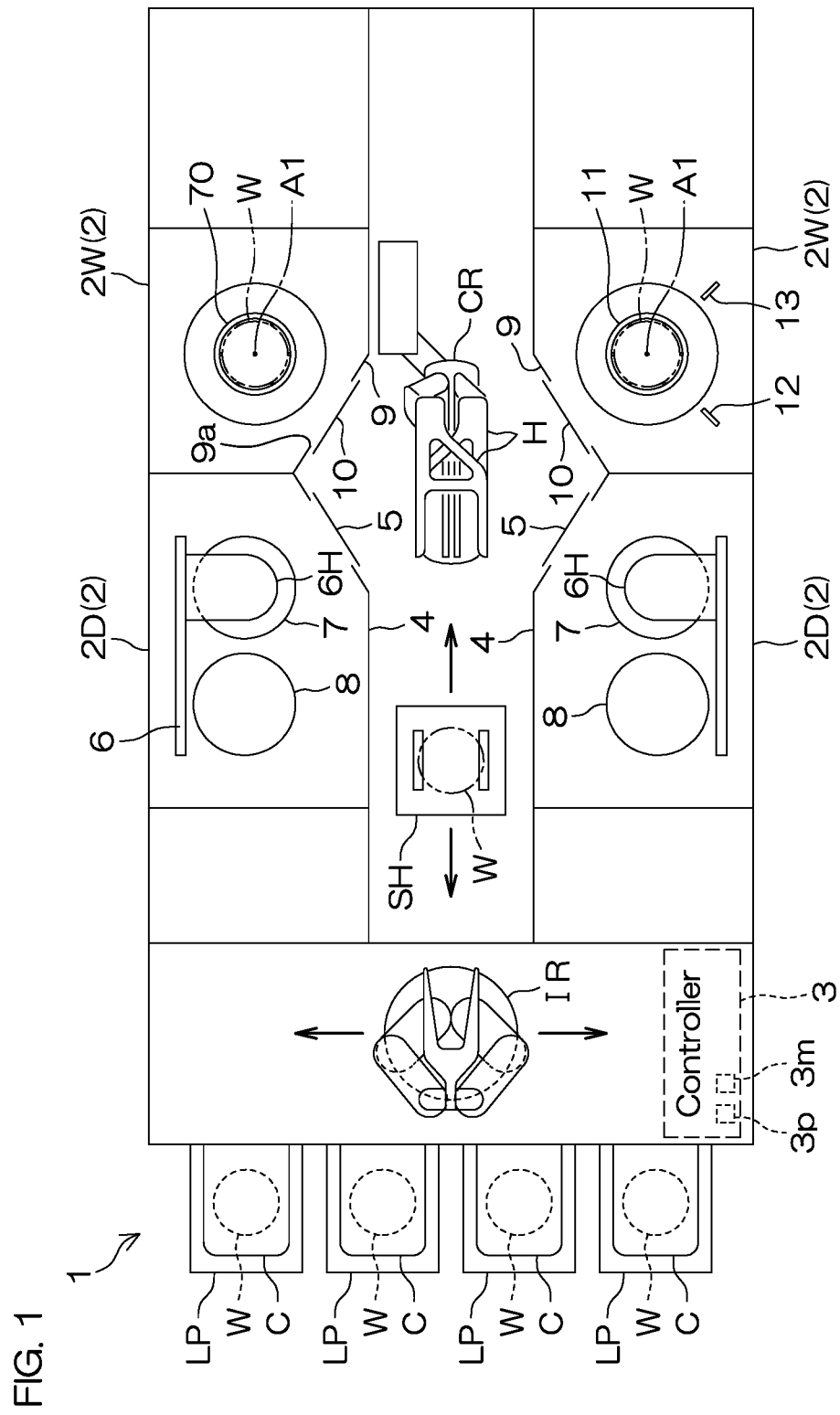
FIG. 1 is a schematic plan view showing a schematic configuration of a substrate processing apparatus according to a preferred embodiment of the present invention.

FIG. 1 is a schematic plan view showing a schematic configuration of a substrate processing apparatus according to a preferred embodiment of the present invention. The substrate processing apparatus 1 is a single-substrate-processing type apparatus that processes substrates W one by one. The substrate W is, for example, a semiconductor wafer. The substrate processing apparatus 1 includes a plurality of load ports LP that hold a plurality of carriers C that house substrates W, respectively, and a plurality of processing units 2 that process substrates W transferred from the plurality of load ports LP by use of a processing fluid, such as a processing liquid or a processing gas.

The substrate processing apparatus 1 additionally includes a transfer unit (IR, SH, CR) that transfers a substrate W and a controller 3 that controls the substrate processing apparatus 1. The controller 3 is, typically, a computer, and includes a memory $3m$ that stores information, such as programs, and a processor $3p$ that controls the substrate processing apparatus 1 in accordance with information stored in the memory $3m$.

The transfer unit (IR, SH, CR) includes an indexer robot IR, a shuttle SH, and a center robot CR that are disposed on a transfer path extending from the plurality of load ports LP to the plurality of processing units 2. The indexer robot IR transfers a substrate W between the plurality of load ports LP and the shuttle SH. The shuttle SH transfers a substrate W while reciprocating between the indexer robot IR and the center robot CR. The center robot CR transfers a substrate W between the shuttle SH and the plurality of processing units 2. The center robot CR further transfers a substrate W among the plurality of processing units 2. A thick-line arrow shown in FIG. 1 indicates a moving direction in which the indexer robot IR and the shuttle SH move.

The plurality of processing units 2 form four towers that are respectively disposed at four positions horizontally away from each other. Each of the towers includes a plurality of processing units 2 stacked together in an up-down direction. The four towers are disposed such that two of the four towers and the remaining two towers are disposed on both sides of the transfer path, respectively. The plurality of processing units 2 include a plurality of dry processing units 2D each of which processes a substrate W in a state in which this substrate W is being dried and a plurality of wet processing units 2W each of which processes a substrate W with a processing liquid. The two towers on the load-port-LP side are formed of the plurality of dry processing units 2D, and the remaining two towers are formed of the plurality of wet processing units 2W.

Figure 2:
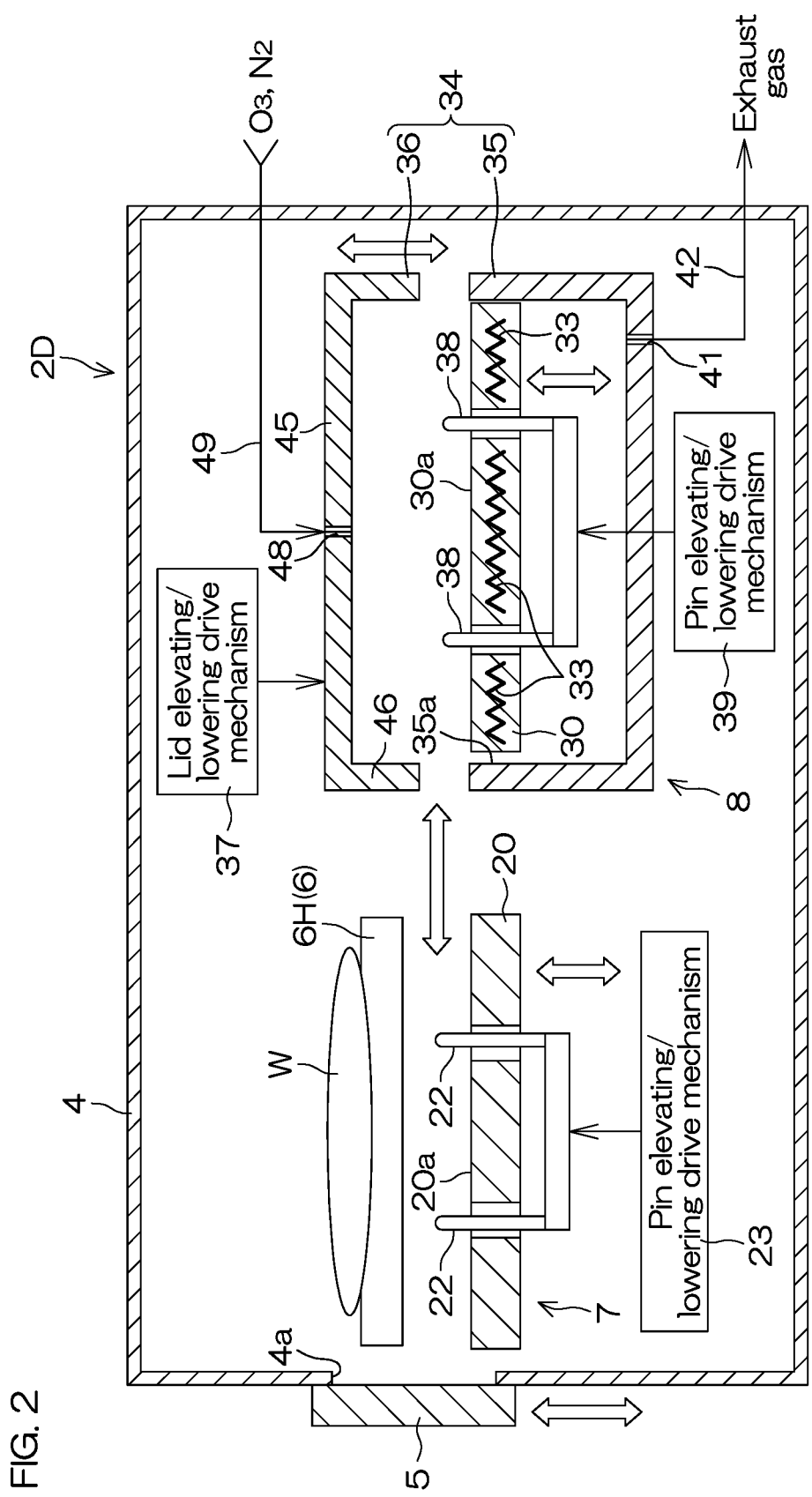
FIG. 2 is an illustrative cross-sectional view shown to describe a configuration example of a dry processing unit included in the substrate processing apparatus.

FIG. 2 is an illustrative cross-sectional view shown to describe a configuration example of the dry processing unit 2D. The dry processing unit 2D includes a dry chamber 4 provided with a carry-in/out opening 4a through which a substrate W passes, a shutter 5 that opens and closes the carry-in/out opening 4a of the dry chamber 4, a thermal processing unit 8 that supplies a processing gas to a substrate W while heating the substrate W in the dry chamber 4, a cooling unit 7 that cools a substrate W, which has been heated by the thermal processing unit 8, in the dry chamber 4, and an internal transfer mechanism 6 that transfers a substrate W within the dry chamber 4. The center robot CR puts a substrate W into or out of the dry chamber 4 through the carry-in/out opening 4a. The cooling unit 7 is disposed in the dry chamber 4 near the carry-in/out opening 4a.

The cooling unit 7 includes a cool plate 20, a lift pin 22 that passes through the cool plate 20 and moves upwardly and downwardly, and a pin elevating/lowering drive mechanism 23 that moves the lift pin 22 upwardly and downwardly. The cool plate 20 is provided with a cooling surface 20a on which a substrate W is placed. A refrigerant path (not shown) along which a refrigerant (typically, cooling water)

circulates is formed in the cool plate 20. The lift pin 22 is moved upwardly and downwardly between an upper position at which a substrate W is supported above the cooling surface 20a and a lower position at which a front end of the lift pin 22 goes below the cooling surface 20a.

The thermal processing unit 8 is provided with a heater 33. More specifically, the thermal processing unit 8 includes a hot plate 30, a thermal processing chamber 34 that houses the hot plate 30, a lift pin 38 that passes through the hot plate 30 and moves upwardly and downwardly, and a pin elevating/lowering drive mechanism 39 that moves the lift pin 38 upwardly and downwardly. The hot plate 30 is provided with a heating surface 30a on which a substrate W is placed, and has a built-in heater 33.

The heater 33 is configured to enable a substrate W placed on the heating surface 30a to be heated to 150° C. or more, and may be configured to enable it to be heated to, for example, 250° C. Following the shape of a substrate W, the heating surface 30a has a planar shape slightly larger than the substrate W. In detail, if the substrate W is circular, the heating surface 30a is formed in a circular shape slightly larger than the substrate W.

The thermal processing chamber 34 is provided with a chamber main body 35 and a lid 36 that moves upwardly and downwardly above the chamber main body 35. The thermal processing unit 8 is provided with a lid elevating/lowering drive mechanism 37 that moves the lid 36 upwardly and downwardly. The chamber main body 35 has an opening 35a that is upwardly open, and the lid 36 opens and closes this opening 35a. The lid 36 is moved upwardly and downwardly between a closed position (lower position) at which the lid 36 closes the opening 35a of the chamber main body 35 and defines a sealed processing space on the inward side and an upper position to which the lid 36 recedes upwardly so as to open the opening 35a. The lift pin 38 is moved upwardly and downwardly between an upper position at which a substrate W is supported above the heating surface 30a and a lower position at which a front end of the lift pin 38 goes below the heating surface 30a.

An exhaust port 41 is formed in a bottom portion of the chamber main body 35. Preferably, the exhaust port 41 is disposed at a plurality of places (for example, three places) with intervals between the places in a circumferential direction. The exhaust port 41 is joined to a piece of exhaust equipment 43 (see FIG. 3) through an exhaust line 42.

The lid 36 includes a plate portion 45 that extends in parallel with the heating surface 30a and a cylinder portion 46 that extends downwardly from a circumferential edge of the plate portion 45. In detail, the plate portion 45 is substantially circular, and, accordingly, the cylinder portion 46 has a circular cylindrical shape. A lower end of the cylinder portion 46 faces an upper end of the chamber main body 35. This makes it possible to open and close the opening 35a of the chamber main body 35 by moving the lid 36 upwardly and downwardly.

A gas introducing port 48 is formed so as to pass through the plate portion 45. In the present preferred embodiment, the gas introducing port 48 is formed in a central portion of the plate portion 45. The gas introducing port 48 is connected to a gas supply line 49. A gas introduced from the gas introducing port 48 is supplied to a processing space defined on its downward side. Therefore, the gas is supplied to a substrate W placed in the processing space. The gas is evenly supplied toward substantially the whole area of the heating surface 30a (therefore toward substantially the whole area of an upper surface of the substrate W).

The internal transfer mechanism 6 transfers a substrate W inside the dry chamber 4. More specifically, the internal transfer mechanism 6 is provided with an internal transfer hand 6H that transfers a substrate W between the cooling unit 7 and the thermal processing unit 8. The internal transfer hand 6H is configured such that a substrate W can be delivered between the internal transfer hand 6H and the lift pin 22 of the cooling unit 7, and such that a substrate W can be delivered between the internal transfer hand 6H and the lift pin 38 of the thermal processing unit 8. This enables the internal transfer hand 6H to operate in such a manner as to receive a substrate W from the lift pin 22 of the cooling unit 7 and then give the substrate W to the lift pin 38 of the thermal processing unit 8. Additionally, this enables the internal transfer hand 6H to operate in such a manner as to receive a substrate W from the lift pin 38 of the thermal processing unit 8 and then give the substrate W to the lift pin 22 of the cooling unit 7.

A typical operation of the dry processing unit 2D is as follows.

When the center robot CR (see FIG. 1) carries a substrate W into the dry chamber 4, the shutter 5 is controlled to be placed at an open position at which the carry-in/out opening 4a is opened. In that state, a hand H of the center robot CR enters the dry chamber 4, and places the substrate W above the cool plate 20. Thereupon, the lift pin 22 rises to the upper position, and receives the substrate W from the hand H of the center robot CR. Thereafter, the hand H of the center robot CR recedes outwardly from the dry chamber 4. Next, the internal transfer hand 6H of the internal transfer mechanism 6 receives the substrate W from the lift pin 2, and transfers the substrate W to the lift pin 38 of the thermal processing unit 8. At this time, the lid 36 is placed at the open position (upper position), and the lift pin 38 supports the substrate W received therefrom at the upper position. After the internal transfer hand 6H recedes from the thermal processing chamber 34, the lift pin 38 falls to the lower position, and places the substrate W on the heating surface 30a. On the other hand, the lid 36 falls to the closed position (lower position), and forms a sealed processing space that contains the hot plate 30. In this state, heat treatment is applied onto the substrate W.

When the heat treatment is finished, the lid 36 rises to the open position (upper position), and the thermal processing chamber 34 is opened. Additionally, the lift pin 38 rises to the upper position, and pushes the substrate W upwardly from the heating surface 30a. In this state, the internal transfer hand 6H of the internal transfer mechanism 6 receives the substrate W from the lift pin 38, and transfers the substrate W to the lift pin 22 of the cooling unit 7. The lift pin 22 supports the substrate W received therefrom at the upper position. The lift pin 22 waits for the receding of the internal transfer hand 6H, and then falls to the lower position, and, as a result, the substrate W is placed on the cooling surface 20a of the cool plate 20. Hence, the substrate W is cooled.

When the substrate W finishes being cooled, the lift pin 22 rises to the upper position, and, as a result, pushes the substrate W upwardly from the cooling surface 20a. In this state, the shutter 5 is opened, and the hand H of the center robot CR enters the dry chamber 4, and is placed below the substrate W supported by the lift pin 22 placed at the upper position. In this state, the lift pin 22 falls, and, as a result, the substrate W is delivered to the hand H of the center robot CR. The hand H holding the substrate W recedes outwardly from the dry chamber 4, and then the shutter 5 closes the carry-in/out opening 4a.

Figure 3:
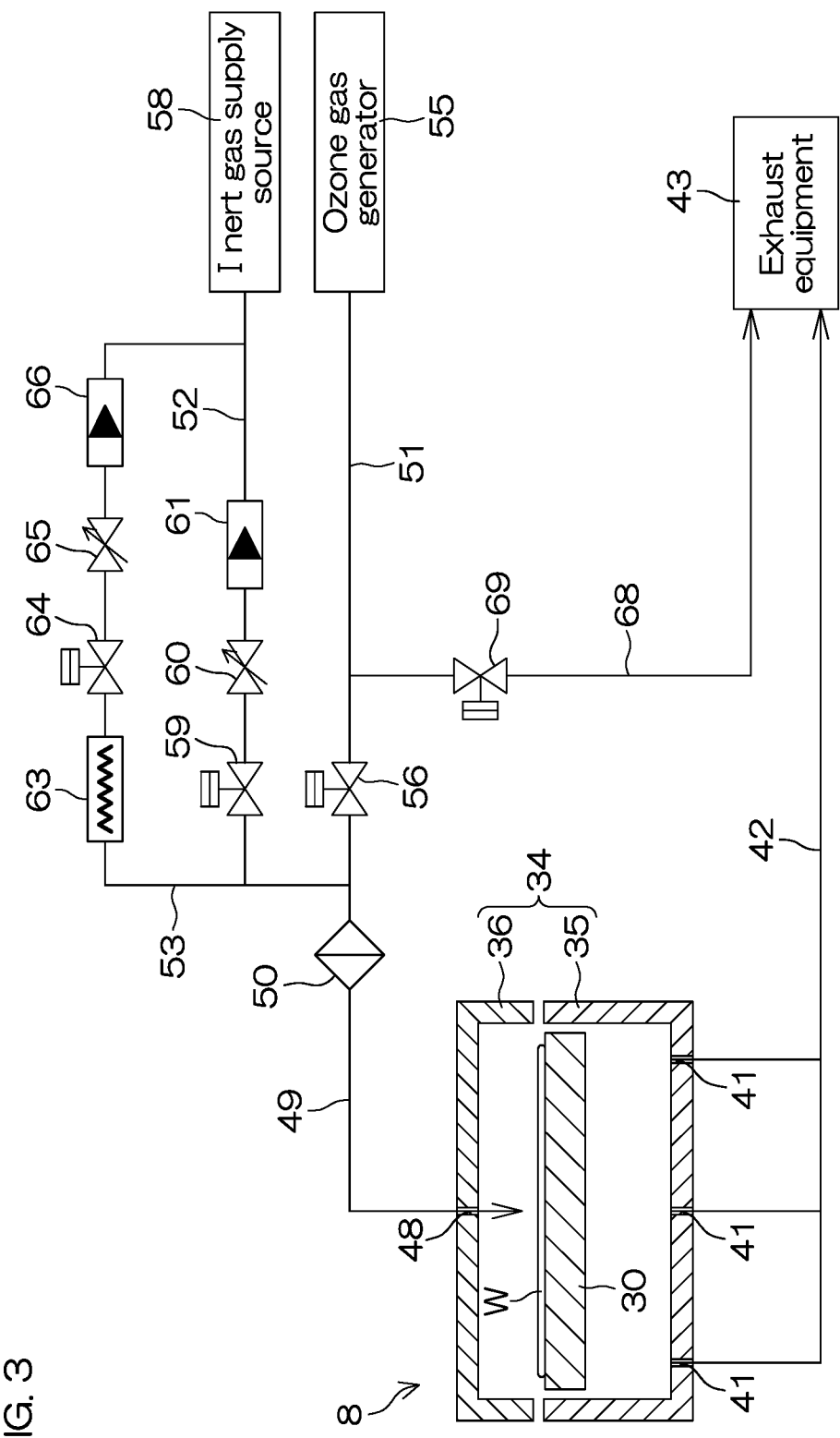
FIG. 3 is a system view shown to describe a configuration example of gas supply/exhaust systems with respect to a thermal processing unit.

FIG. 3 is a system view shown to describe a configuration example of gas supply/exhaust systems with respect to a thermal processing unit 8.

An ozone gas supply line 51, a room-temperature inert gas supply line 52, and a high-temperature inert gas supply line 53 are joined to the gas supply line 49 (pipe) connected to the gas introducing port 48. A filter 50 that filters foreign substances included in a circulating gas is interposed in the gas supply line 49.

The ozone gas supply line 51 includes a pipe that supplies an ozone gas generated by an ozone gas generator 55. The temperature of the ozone gas is less than 150° C., and is, typically, room temperature. An ozone gas valve 56 that opens and closes a flow passage of the ozone gas supply line 51 is interposed in the ozone gas supply line 51. The ozone gas supply line 51 and the ozone gas valve 56 are one example of an ozone gas supply unit.

The room-temperature inert gas supply line 52 includes a pipe that supplies a room-temperature inert gas supplied from an inert gas supply source 58. The inert gas is a chemically inert gas, such as nitrogen gas or argon gas. The room-temperature inert gas supply line 52 supplies an inert gas supplied from the inert gas supply source 58 to the gas supply line 49 without heating the inert gas supplied therefrom. A room-temperature inert gas valve 59 that opens and closes a flow passage of the room-temperature inert gas supply line 52, a flow-rate regulating valve 60 that regulates a flow rate, and a flowmeter 61 are interposed in the room-temperature inert gas supply line 52. The room-temperature inert gas supply line 52 and the room-temperature inert gas valve 59, etc., are one example of a room-temperature inert gas supply unit.

The high-temperature inert gas supply line 53 includes a pipe that supplies an inert gas higher in temperature than room temperature. In detail, the high-temperature inert gas supply line 53 heats and supplies a room-temperature inert gas supplied from the inert gas supply source 58. In more detail, a heater 63 is interposed in the high-temperature inert gas supply line 53. The heater 63 heats an inert gas flowing through the high-temperature inert gas supply line 53 to a high temperature of 150° C. or more. In even more detail, the heater 63 heats an inert gas flowing through the high-temperature inert gas supply line 53 such that a processing space in the thermal processing chamber 34 can be filled with an inert gas whose temperature is 150° C. or more. A high-temperature inert gas valve 64 that opens and closes a flow passage of the high-temperature inert gas supply line 53, a flow-rate regulating valve 65 that regulates a flow rate, and a flowmeter 66 are interposed in the high-temperature inert gas supply line 53 on the upstream side with respect to the heater 63. The high-temperature inert gas supply line 53, the heater 63, the high-temperature inert gas valve 64, etc., are one example of a high-temperature inert gas supply unit.

The exhaust line (pipe) 42 is connected to the exhaust port 41 of the thermal processing chamber 34. The exhaust line 42 is connected to the exhaust equipment 43. Exhausting performed by the exhaust line 42 chiefly prevents an ozone gas from flowing outwardly from the thermal processing chamber 34.

An ozone exhaust line (pipe) 68 is connected to the ozone gas supply line 51 on the upstream side with respect to the ozone gas valve 56. The ozone exhaust line 68 is connected to the exhaust equipment 43. An ozone exhaust valve 69 is interposed in the ozone exhaust line 68. The ozone exhaust valve 69 is opened when the ozone gas remaining in the ozone gas supply line 51 is discharged after stopping the operation of the ozone gas generator 55.

Figure 4:
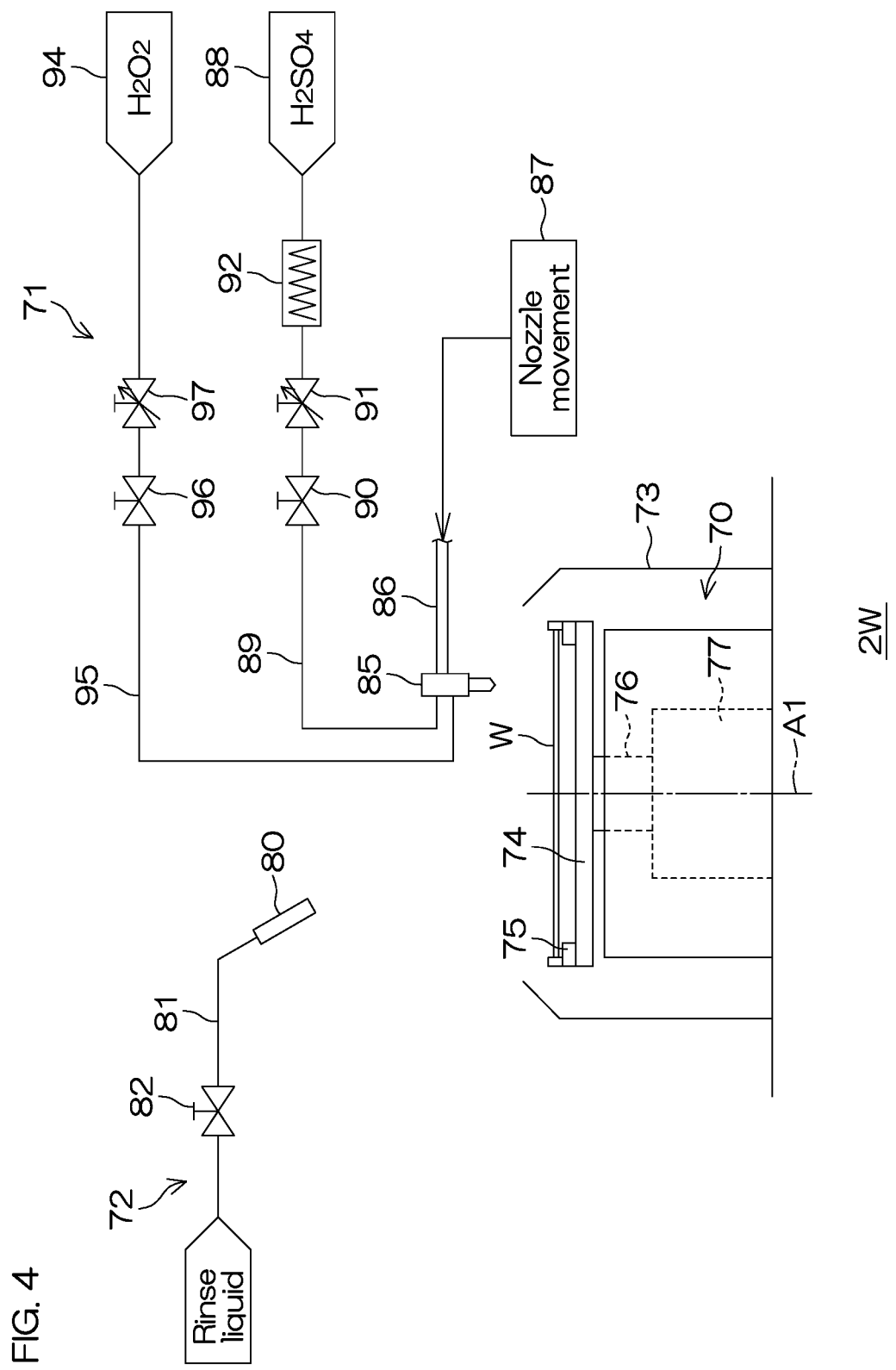
FIG. 4 is an illustrative cross-sectional view shown to describe a configuration example of a wet processing unit included in the substrate processing apparatus.

FIG. 4 is an illustrative cross-sectional view shown to describe a configuration example of the wet processing unit 2W.

The wet processing unit 2W is a single-substrate processing type liquid processing unit that processes substrates W one by one. The wet processing unit 2W includes a box-shaped wet chamber 9 (see FIG. 1) that defines an internal space, a spin chuck 70 (substrate holding means, substrate holder) that rotates a substrate W around a vertical rotational axis A1 passing through a center of the substrate W while holding the single substrate W in a horizontal orientation in the wet chamber 9, an SPM supply unit 71 that supplies a processing liquid including a sulfuric acid (in the present preferred embodiment, a sulfuric acid/hydrogen peroxide mixture (SPM)) to the substrate W held by the spin chuck 70, a rinse liquid supply unit 72, and a cylindrical cup 73 that surrounds the spin chuck 70. As shown in FIG. 1, a carry-in/out opening 9a through which a substrate W passes is formed in the wet chamber 9, and a shutter 10 that opens and closes this carry-in/out opening 9a is provided. The wet chamber 9 is one example of a liquid processing chamber in which substrate processing is performed while using a processing liquid in the wet chamber 9.

The spin chuck 70 includes a disk-shaped spin base 74 that is held in a horizontal orientation, a plurality of chuck pins 75 that hold a substrate W in a horizontal orientation above the spin base 74, a rotational shaft 76 that extends downwardly from a central portion of the spin base 74, and a spin motor 77 that rotates a substrate W and the spin base 74 around the rotational axis A1 by rotating the rotational shaft 76. The spin chuck 70 is not limited to a gripping-type chuck in which the plurality of chuck pins 75 are brought into contact with a peripheral end surface of a substrate W, and may be a vacuum-type chuck in which a substrate W is horizontally held by allowing a rear surface (lower surface) of a substrate W, which is a non-device formation surface, to be sucked and stuck onto an upper surface of the spin base 74.

The cup 73 is disposed at a more outward position (in a direction away from the rotational axis A1) than a substrate W held by the spin chuck 70. The cup 73 surrounds a periphery of the spin base 74. The cup 73 catches a processing liquid discharged to the surroundings of the substrate W when the processing liquid is supplied to the substrate W in a state in which the spin chuck 70 is rotating the substrate W. The processing liquid caught by the cup 73 is sent to a recovery device or a drainage device (not shown).

The rinse liquid supply unit 72 includes a rinse liquid nozzle 80 that discharges a rinse liquid toward a substrate W held by the spin chuck 70, a rinse liquid pipe 81 that supplies a rinse liquid to the rinse liquid nozzle 80, and a rinse liquid valve 82 that performs switching between the supply and the supply stoppage of a rinse liquid from the rinse liquid pipe 81 to the rinse liquid nozzle 80. The rinse liquid nozzle 80 may be a stationary nozzle that discharges a rinse liquid in a state in which a discharge port of the rinse liquid nozzle 80 has been rested. The rinse liquid supply unit 72 may be provided with a rinse-liquid-nozzle moving unit that moves a landing position of a rinse liquid with respect to the upper surface of the substrate W by moving the rinse liquid nozzle 80.

When the rinse liquid valve 82 is opened, a rinse liquid supplied from the rinse liquid pipe 81 to the rinse liquid nozzle 80 is discharged from the rinse liquid nozzle 80 toward a central portion of the upper surface of the substrate W. The rinse liquid is, for example, DIW (deionized water). Without being limited to DIW, the rinse liquid may be any one of carbonated water, electrolyzed ion water, hydrogen water, ozone water, as well as aqueous hydrochloric acid solution of a dilute concentration (for example, about 10 to 100 ppm). The temperature of the rinse liquid may be room temperature, or may be a higher temperature (for example, 70 to 90° C.) than room temperature.

The SPM supply unit 71 includes an SPM nozzle 85 that discharges SPM toward an upper surface of a substrate W, a nozzle arm 86 that has a forward end portion to which the SPM nozzle 85 is attached, and a nozzle moving unit 87 that moves the SPM nozzle 85 by moving the nozzle arm 86.

The SPM nozzle 85 is, for example, a straight nozzle that discharges SPM in a continuous flow state, and is attached to the nozzle arm 86, for example, in a perpendicular orientation in which a processing liquid is discharged in a direction perpendicular to the upper surface of the substrate W. The nozzle arm 86 extends in a horizontal direction, and is disposed so as to be turnable around a swing axis (not shown) that extends in a vertical direction around the spin chuck 70.

The nozzle moving unit 87 horizontally moves the SPM nozzle 85 along a track that goes through the central portion of the upper surface of the substrate W in a plan view by allowing the nozzle arm 86 to turn around the swing axis. The nozzle moving unit 87 horizontally moves the SPM nozzle 85 between a processing position at which SPM that has been discharged from the SPM nozzle 85 lands on the upper surface of the substrate W and a home position at which the SPM nozzle 85 is located around the spin chuck 70 in a plan view. The processing position includes a central position at which SPM that has been discharged from the SPM nozzle 85 lands on the central portion of the upper surface of the substrate W and a peripheral position at which SPM that has been discharged from the SPM nozzle 85 lands on a peripheral edge portion of the upper surface of the substrate W.

The SPM supply unit 71 includes a sulfuric-acid pipe 89 that is connected to the SPM nozzle 85 and to which a sulfuric acid ($H_2SO_4$) is supplied from a sulfuric acid supply source 88 and a hydrogen-peroxide-water pipe 95 that is connected to the SPM nozzle 85 and to which hydrogen peroxide water ($H_2O_2$) is supplied from a hydrogen-peroxide-water supply source 94.

A sulfuric acid supplied from the sulfuric acid supply source 88 and hydrogen peroxide water supplied from the hydrogen-peroxide-water supply source 94 are both aqueous solutions. The concentration of the sulfuric acid is, for example, 90% to 98%, and the concentration of the hydrogen peroxide water is, for example, 30% to 50%.

A sulfuric-acid valve 90 that opens and closes a flow passage of the sulfuric-acid pipe 89, a sulfuric-acid-flow-rate regulating valve 91 that changes the flow rate of a sulfuric acid, and a heater 92 that heats a sulfuric acid are interposed in the sulfuric-acid pipe 89 in this order from the SPM-nozzle-85 side. The heater 92 heats a sulfuric acid to a higher temperature than room temperature (fixed temperature in a range of 70° C. to 190° C. e.g., 90° C.).

A hydrogen-peroxide-water valve 96 that opens and closes a flow passage of the hydrogen-peroxide-water pipe 95 and a hydrogen-peroxide-water-flow-rate regulating valve 97 that changes the flow rate of hydrogen peroxide water are interposed in the hydrogen-peroxide-water pipe 95 in this order from the SPM-nozzle-85 side. Hydrogen peroxide water having room temperature (for example, about 23° C.) that has not undergone a temperature adjustment is supplied to the hydrogen-peroxide-water valve 96 through the hydrogen-peroxide-water pipe 95.

The SPM nozzle 85 has, for example, a substantially circular cylindrical casing. A mixing chamber is formed inside the casing. The sulfuric-acid pipe 89 is connected to a sulfuric-acid inlet disposed at a sidewall of the casing of the SPM nozzle 85. The hydrogen-peroxide-water pipe 95 is connected to a hydrogen-peroxide-water inlet disposed at the sidewall of the casing of the SPM nozzle 85.

When the sulfuric-acid valve 90 and the hydrogen-peroxide-water valve 96 are opened, a sulfuric acid (high-temperature sulfuric acid) sent from the sulfuric-acid pipe 89 is supplied from the sulfuric-acid inlet of the SPM nozzle 85 to the mixing chamber thereinside, and hydrogen peroxide water sent from the hydrogen-peroxide-water pipe 95 is supplied from the hydrogen-peroxide-water inlet of the SPM nozzle 85 to the mixing chamber thereinside.

The sulfuric acid and the hydrogen peroxide water that have flowed into the mixing chamber of the SPM nozzle 85 are sufficiently stirred and mixed in the mixing chamber. As a result of this mixing, the sulfuric acid and the hydrogen peroxide water are evenly mixed together, and SPM (a sulfuric acid/hydrogen peroxide mixture) is generated by reactions to each other. SPM includes a peroxymonosulfuric acid ($H_2SO_5$) having strong oxidative power. A sulfuric acid heated to a high temperature is supplied, and the mixture of the sulfuric acid and the hydrogen peroxide water is an exothermic reaction, and therefore a high-temperature SPM is generated. In detail, SPM is generated that has a higher temperature (100° C. or more. e.g., 160° C.) than the temperature of each of the sulfuric acid and the hydrogen peroxide water that have not yet been mixed together. The high-temperature SPM generated in the mixing chamber of the SPM nozzle 85 is discharged from a discharge port bored in a front end (lower end) of the casing toward the substrate W.

Figure 5:
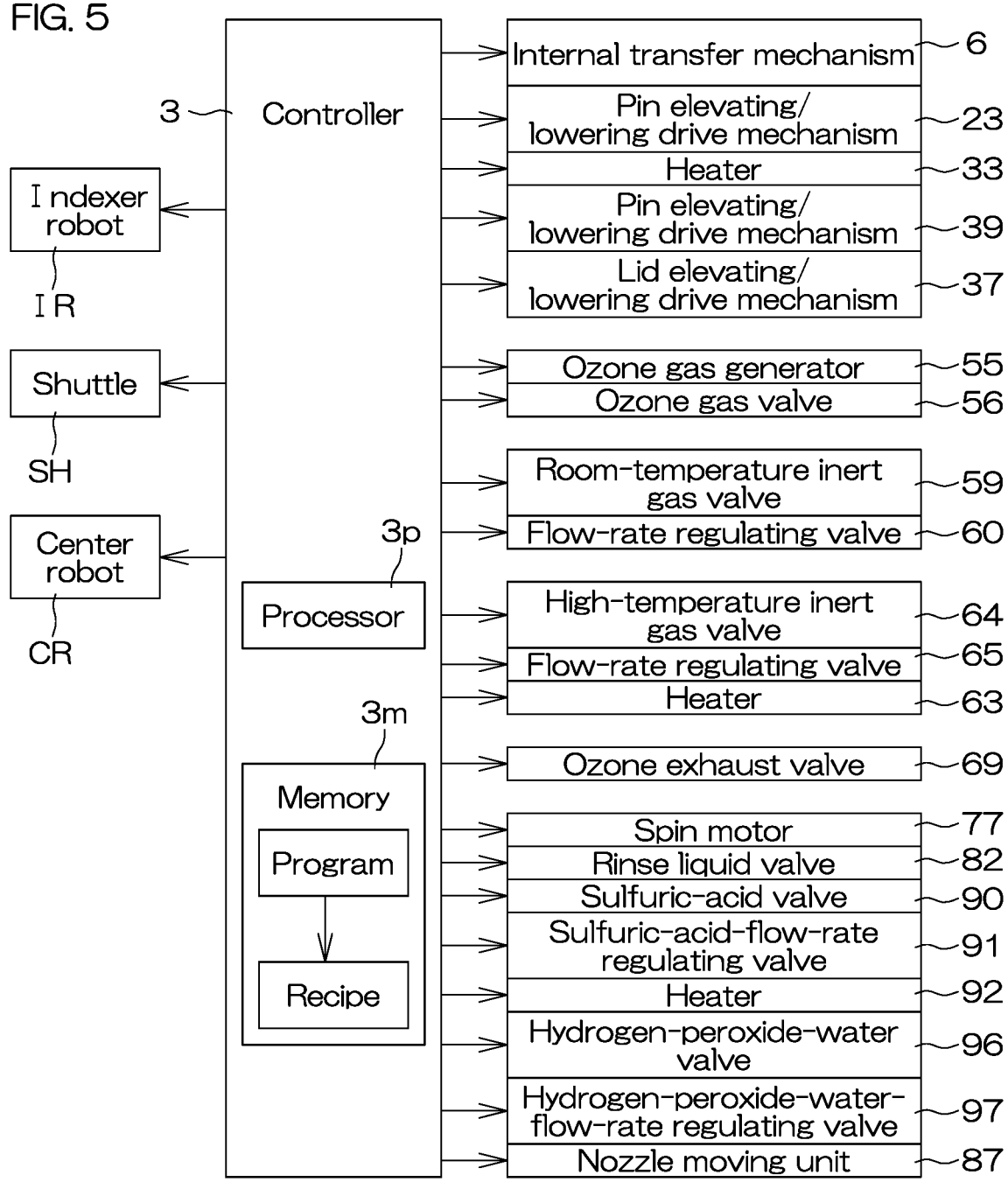
FIG. 5 is a block diagram shown to describe a configuration example relative to the control of the substrate processing apparatus.

FIG. 5 is a block diagram shown to describe a configuration example relative to the control of the substrate processing apparatus 1. The controller 3 is formed of, for example, a microcomputer, etc. The controller 3 includes a memory 3*m* that stores information, such as a program, and a processor 3*p* (CPU) that controls the substrate processing apparatus 1 in accordance with information stored in the memory 3*m*. A recipe showing a processing procedure and processing steps of a substrate W is stored in the memory 3*m*. The controller 3 is configured (programmed) to perform the processing of a substrate W by controlling the substrate processing apparatus 1 on the basis of the recipe stored in the memory 3*m*.

Specific to-be-controlled components, which are controlled by the controller 3, include the indexer robot IR, the shuttle SH, the center robot CR, the internal transfer mechanism 6, the pin elevating/lowering drive mechanisms 23 and 39, the heater 33, the lid elevating/lowering drive mechanism 37, the ozone gas generator 55, the ozone gas valve 56, the room-temperature inert gas valve 59, the flow-rate regulating valve 60, the heater 63, the high-temperature inert gas valve 64, the flow-rate regulating valve 65, the ozone exhaust valve 69, the spin motor 77, the rinse liquid valve 82, the nozzle moving unit 87, the sulfuric-acid valve 90, the sulfuric-acid-flow-rate regulating valve 91, the heater 92, the hydrogen-peroxide-water valve 96, the hydrogen-peroxide-water-flow-rate regulating valve 97, etc.

Figure 6A:
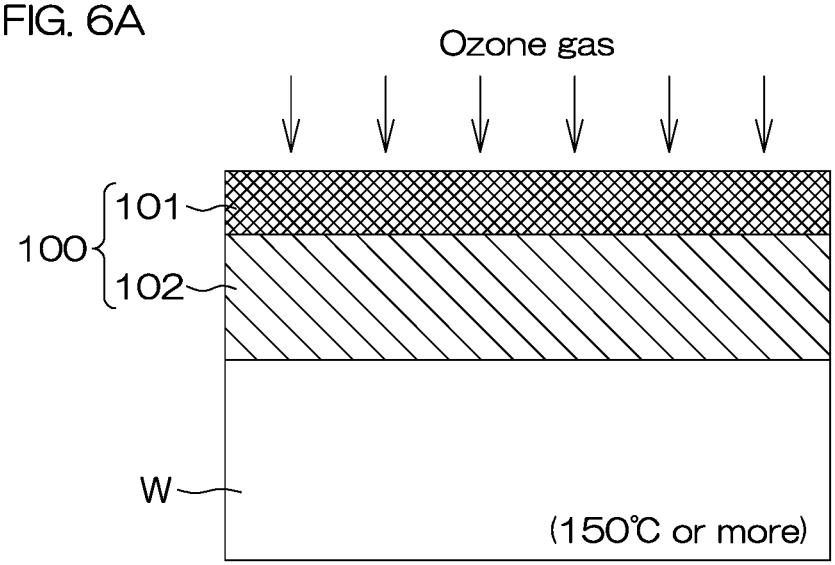
FIG. 6A to FIG. 6C show a typical example of substrate processing performed by the substrate processing apparatus.
Figure 6B:
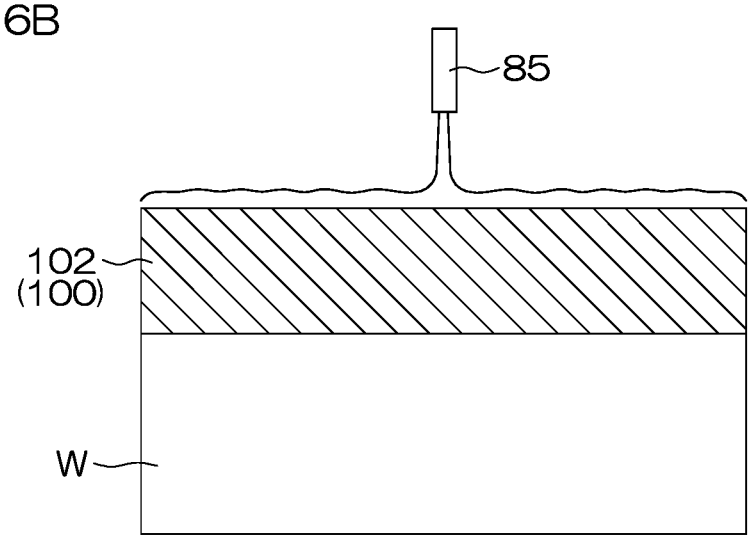
Figure 6C:
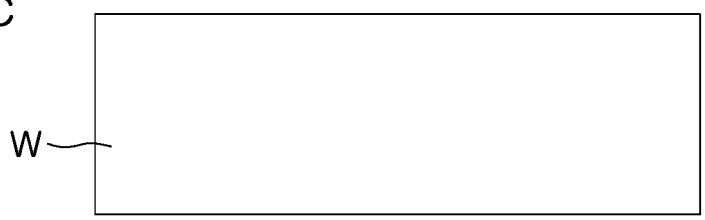

FIG. 6A to FIG. 6C show a typical example of substrate processing performed by the substrate processing apparatus 1. A to-be-processed substrate W is, for example, a silicon substrate (silicon wafer). A film of a resist 100 is formed on a front surface of the substrate W. The resist 100 is used as a mask for selective ion implantation into the substrate W.

Particularly, the resist 100, which is present on the substrate W that has undergone an ion implantation process by use of high doses, has its surface layer portion at which a hardened layer 101 is formed. The hardened layer 101 is formed by a change in quality, such as carbonization, of the resist 100. A resist layer 102 that is not hardened (which is hereinafter referred to as a "non-hardened layer 102") is present on the downward side of the hardened layer 101 (i.e., the front-surface side of the substrate W). A description will be here given of substrate processing in which the resist 100 having the hardened layer 101 at the surface layer portion is peeled off or removed from the front surface of the substrate W, i.e., will be here given of a resist peel-off process or a resist removing process.

The substrate processing includes an ozone process (FIG. 6A) and an SPM process (FIG. 6B).

The ozone process (see FIG. 6A) is a process in which the substrate W is heated, and an ozone gas is supplied to the front surface of the substrate W being heated (in more detail, is supplied to the hardened layer 101 of the resist 100). The heating temperature, i.e., the temperature of the substrate W being heated is set at 150° C. or more. When the ozone gas reaches the front surface of the substrate W, the ozone gas receives heat from the substrate W, and is heated. As a result, the ozone gas is decomposed into oxygen and an oxygen radical. The thus generated oxygen radical and the hardened layer 101 react to each other, and the hardened layer 101 volatilizes into the atmosphere. Hence, the hardened layer 101 is removed. In other words, the ozone process is a hardened-layer removing process in which the hardened layer 101 of the resist 100 is removed. The hardened layer 101 is removed at least partially, and is removed, preferably, wholly.

The SPM process (see FIG. 6B) is performed after the ozone process (hardened-layer removing process). The SPM process is a liquid process in which SPM is supplied to the front surface of the substrate W (i.e., surface on which the resist 100 is formed). SPM functions to remove the hardened layer 101 and the non-hardened layer 102 of the resist 100, and yet the hardened-layer removing speed is very smaller than the non-hardened-layer removing speed. Therefore, if the hardened layer 101 is not present at the surface of the resist 100, it is possible to swiftly remove the resist 100 on the front surface of the substrate W (the non-hardened layer 102) by the supply of SPM (see FIG. 6C). Even if the hardened layer 101 slightly remains at the front surface of the resist 100, it is possible to remove the slight hardened layer 101 by performing the SPM process for a short time, and therefore it is possible to likewise remove the resist 100 in a short time. Additionally, even if the hardened layer 101 remains at the surface of the resist 100, SPM will permeate through the non-hardened layer 102 and remove the non-hardened layer 102 if there is an exposed portion of the non-hardened layer 102, i.e., if there is a liquid path that passes through the hardened layer 101 and that reaches the non-hardened layer 102. As a result, the hardened layer 101 is lifted off together with the non-hardened layer 102, and therefore it is possible to likewise remove the entirety of the resist 100 from the front surface of the substrate W by performing the SPM process for a short time.

As thus described, the SPM process (FIG. 6B) is performed after removing the hardened layer 101 through the ozone process (FIG. 6A), hence making it possible to more swiftly remove the resist 100 from the front surface of the substrate W than in a case in which the SPM process is performed without performing the ozone process (FIG. 6C).

Figure 7:
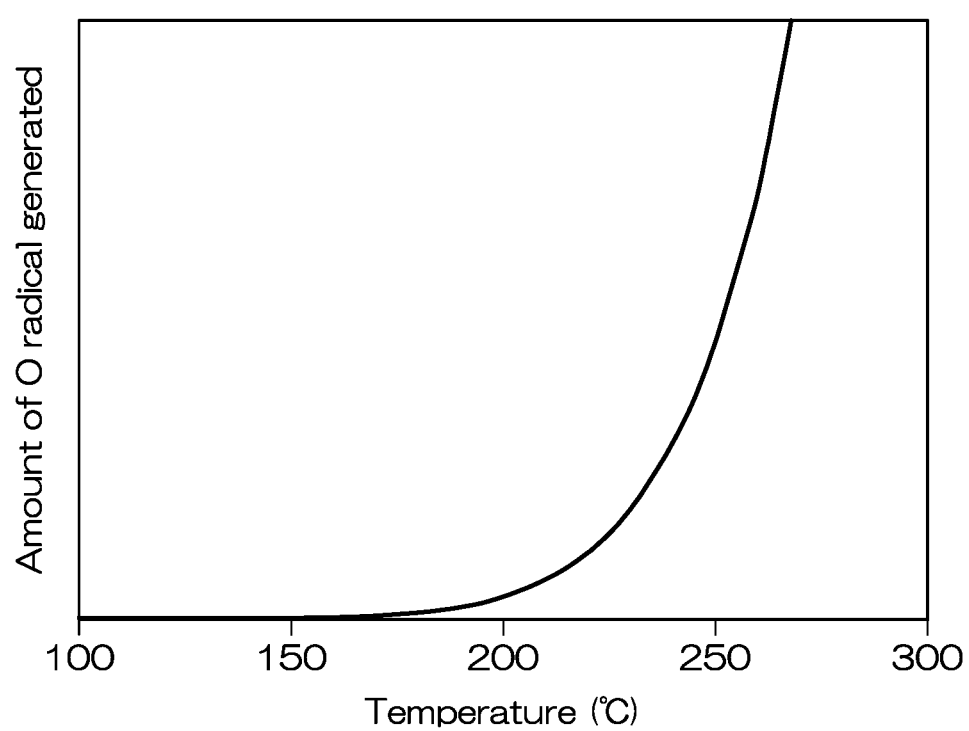
FIG. 7 is a view shown to describe thermal decomposition of an ozone gas.

FIG. 7 is a view shown to describe thermal decomposition of an ozone gas. It is known that ozone ($O_3$) brings about thermal decomposition and generates an oxygen radical by giving energy equal to or more than activation energy. The decomposition rate (chemical reaction rate constant k1) becomes greater in proportion to a rise in temperature. It is understood from FIG. 7 that the chemical reaction rate constant is k1>0, and the oxygen radical is generated when the temperature is 150° C. or more. Therefore, it is possible to bring about a thermal decomposition reaction near the front surface of the substrate by setting the temperature of the substrate W in the ozone process at 150° C. or more, and it is possible to allow the oxygen radical generated by the thermal decomposition reaction to act on the hardened layer of the resist. Preferably, in order to avoid resist popping, the temperature of the substrate W is set at 170° C. or less when the substrate W is heated.

The thermal decomposition of the ozone gas can also be used for the purpose of rendering the ozone gas harmless. In other words, it is possible to thermally decompose the ozone gas by setting the ozone gas at 150° C. or more when the ozone gas remains in the thermal processing chamber 34 after finishing the ozone process. The oxygen radical generated by thermal decomposition has a short lifetime, and is swiftly extinguished and turned into oxygen, and therefore the oxygen radical is essentially harmless.

FIG. 8A and FIG. 8B are flowcharts each shown to describe the flow of specific substrate processing performed by the substrate processing apparatus 1. FIG. 8A shows the details of the ozone process (hardened-layer removing process), and FIG. 8B shows the details of the SPM process subsequent to the ozone process. These processes are realized by allowing the controller 3 to control corresponding to-be-controlled components.

A not-yet-processed substrate W is taken out by the indexer robot IR, and is delivered to the shuttle SH. The center robot CR receives the substrate W, and carries the substrate W into the dry chamber 4. The substrate W carried in the dry chamber 4 is delivered to the lift pin 38 of the thermal processing unit 8 by means of the internal transfer mechanism 6, and is placed on the heating surface 30a of the hot plate 30 by lowering the lift pin 38 (step S1). Thereafter, the lid 36 is lowered, and a state is reached in which the substrate W is placed on the hot plate 30 in an enclosed space defined by the chamber main body 35 and the lid 36.

The hot plate 30 performs a heating process in which the hot plate 30 heats the substrate W placed on the heating surface 30a to a temperature of 150° C. to 170° C. (for example, 170° C.) (step S2). In parallel with this heating process, an ozone gas is introduced into the thermal processing chamber 34, and an ozone-gas supplying step is performed (step S3). In other words, the ozone gas valve 56 is opened, and, as a result, an ozone gas is introduced from the gas introducing port 48, and an internal atmosphere in the thermal processing chamber 34 is discharged from the exhaust port 41. Hence, air in the thermal processing chamber 34 is replaced with the ozone gas, and the ozone gas reaches the front surface of the substrate W (more specifically, reaches the surface of the hardened layer) that is being heated on the hot plate 30. Thereupon, the thermal decomposition of the ozone gas occurs on the front surface of the substrate W, and an oxygen radical is generated. The hardened layer of the resist is removed by the function of the oxygen radical. This process is performed for a predetermined time (for example, for about 30 seconds). The ozone gas introduced in the thermal processing chamber 34 is less than 150° C. (typically, room temperature). The concentration of the ozone gas may be, for example, 100 g/cm³ to 200 g/cm³. Additionally, the supply flow rate of the ozone gas may be about 5 to 20 liter/minute.

When a process in which the hardened layer is removed by the oxygen radical is finished, the controller 3 closes the ozone gas valve 56 so as to stop the supply of the ozone gas (step S4), and, instead, the controller 3 opens the high-temperature inert gas valve 64. Hence, a high-temperature inert gas is introduced from the gas inlet into the thermal processing chamber 34, and a high-temperature inert gas supplying step is performed (step S5). This high-temperature inert gas is supplied into the thermal processing chamber 34 while keeping the temperature at 150° C. or more (for example, 170° C.). As a result, the ozone gas remaining in the thermal processing chamber 34 is thermally decomposed. There is a place at which gas retention occurs in the thermal processing chamber 34, particularly, around the cylinder portion 46 of the lid 36 (see FIG. 2). When a high-temperature inert gas is supplied to such a gas-retention place, the ozone gas retained at the gas-retention place is thermally decomposed, and is swiftly rendered harmless. The supply of the high-temperature inert gas is performed, for example, for about ten seconds.

Even if the substrate W is heated by the hot plate 30° C. to 150° C. or more (for example, about 170° C.), the temperature of the lid 36 or the like is less than 150° C. (for example, about 100° C.), and the thermal decomposition of ozone does not occur at a position away from the substrate W and from the hot plate 30. In other words, if the temperature of a member placed away from the substrate W, particularly, the temperature of a member placed on a supply path of an ozone gas leading to the substrate W is kept at less than 150° C. even in the thermal processing chamber 34, it is possible to prevent the thermal decomposition of ozone from occurring before the ozone gas reaches the substrate W. This makes it possible to efficiently bring about the thermal decomposition of ozone near the front surface of the substrate W, hence making it possible to raise processing efficiency.

Next, the controller 3 closes the high-temperature inert gas valve 64, and, instead, the controller 3 opens the room-temperature inert gas valve 59. Hence, a room-temperature inert gas is introduced from the gas introducing port 48 into the thermal processing chamber 34, and a room-temperature-inert-gas supplying step (step S6) is performed. As a result, an atmosphere in the thermal processing chamber 34 is replaced with a room-temperature inert gas. Hence, the thermal processing chamber 34 is cooled. The supply of the room-temperature inert gas may be performed, for example, for 30 seconds or less. Thereafter, the controller 3 closes the room-temperature inert gas valve 59.

Next, the controller 3 allows the lid 36 to recede upwardly, and opens the thermal processing chamber 34. Thereafter, the lift pin 38 pushes the substrate W upwardly, and the substrate W pushed thereby is transferred to the cooling unit 7 by means of the internal transfer mechanism 6, and is delivered to the lift pin 22. Thereafter, the lift pin 22 is lowered, and the substrate W is placed on the cool plate 20, and is cooled (step S7). Hence, the substrate W is cooled to about room temperature. After cooling the substrate, the lift pin 22 pushes the substrate W upwardly, and the substrate W is carried out of the dry chamber 4 by means of the center robot CR (step S8).

The center robot CR carries the substrate W into the wet chamber 9 for the SPM process (wet processing step) (step S11). In detail, the controller 3 allows the hand H of the center robot CR to enter the inside of the wet chamber 9 while controlling the center robot CR (see FIG. 1) holding the substrate W, and, as a result, the substrate W is placed on the spin chuck 70 in a state in which the front surface of the substrate W (i.e., surface on which the resist is formed) is directed upwardly. Thereafter, the controller 3 allows the substrate W to start being rotated by the spin motor 77 (step S12). The rotation speed of the substrate W is raised to a predetermined processing rotation speed (within a range of 100 to 500 rpm. For example, about 300 rpm), and is kept at the processing rotation speed.

When the rotation speed of the substrate W reaches the processing rotation speed, the controller 3 performs an SPM processing step of supplying SPM, which is a processing liquid including a sulfuric acid, to the substrate W (step S13). In detail, the controller 3 moves the SPM nozzle 85 from the home position to the processing position while controlling the nozzle moving unit 87. Hence, the SPM nozzle 85 is placed above the substrate W.

After the SPM nozzle 85 is placed above the substrate W, the controller 3 opens the sulfuric-acid valve 90 and the hydrogen-peroxide-water valve 96. Hence, hydrogen peroxide water flowing through the hydrogen-peroxide-water pipe 95 and a sulfuric acid flowing through the inside of the sulfuric-acid pipe 89 are supplied to the SPM nozzle 85. As a result, the sulfuric acid and the hydrogen peroxide water are mixed with each other in a mixing chamber of the SPM nozzle 85, and a high-temperature SPM (for example, 160° C.) is generated (generating step). The high-temperature SPM is discharged from the discharge port of the SPM nozzle 85, and lands on the upper surface of the substrate W (supplying step). The controller 3 moves the landing position of SPM with respect to the upper surface of the substrate W between its central portion and its peripheral edge portion while controlling the nozzle moving unit 87.

SPM, which has been discharged from the SPM nozzle 85, lands on the upper surface of the substrate W rotating at the processing rotation speed (for example, 300 rpm), and then flows outwardly along the upper surface of the substrate W by means of a centrifugal force. Therefore, SPM is supplied to the whole area of the upper surface of the substrate W, and a liquid film of SPM with which the whole area of the upper surface of the substrate W is covered is formed on the substrate W. This process is performed for a predetermined SPM processing time (for example, about 30 seconds), and, as a result, the resist on the front surface of the substrate W is removed by SPM.

When a predetermined SPM processing time elapses from the start of SPM discharge, the SPM processing step (step S13) is finished. In detail, the controller 3 closes the hydrogen-peroxide-water valve 96 and the sulfuric-acid valve 90. Additionally, the controller 3 allows the SPM nozzle 85 to move from the processing position to the home position while controlling the nozzle moving unit 87. Hence, the SPM nozzle 85 recedes from above the substrate W.

Next, a rinse-liquid supplying step in which a rinse liquid is supplied to the substrate W is performed (step S14). In detail, the controller 3 opens the rinse liquid valve 82, and discharges a rinse liquid from the rinse liquid nozzle 80 toward the central portion of the upper surface of the substrate W. SPM on the substrate W is replaced with the rinse liquid discharged from the rinse liquid nozzle 80, and is washed away. When a predetermined rinse-liquid supply time elapses after opening the rinse liquid valve 82, the controller 3 closes the rinse liquid valve 82, and allows the rinse liquid to stop being discharged from the rinse liquid nozzle 80.

Next, a drying step (step S15) in which the substrate W is dried is performed. In detail, the controller 3 accelerates the substrate W to a dry rotation speed (for example, several thousand rpm) while controlling the spin motor 77, and rotates the substrate W at the dry rotation speed. Hence, a great centrifugal force is applied to a liquid on the substrate W, and the liquid adhering to the substrate W is shaken off outwardly from the substrate W. The liquid is removed from the substrate W in this way, and the substrate W is dried. Thereafter, when a predetermined time elapses after the high-speed rotation of the substrate W is started, the controller 3 allows the substrate W to stop being rotated by the spin chuck 70 while controlling the spin motor 77 (step S16).

Next, a carrying-out step in which the substrate W is carried out of the wet chamber 9 is performed (step S17). In detail, the controller 3 allows the hand H of the center robot CR to enter the inside of the wet chamber 9 and to hold the substrate W placed on the spin chuck 70 and then to recede from the wet chamber 9. Hence, the already-processed substrate W is carried out of the chamber.

The center robot CR delivers the substrate W to the shuttle SH. The shuttle SH transfers the substrate W toward the indexer robot IR. The indexer robot IR receives the already-processed substrate W from the shuttle SH, and houses the substrate W in the carrier C.

Figure 9B:
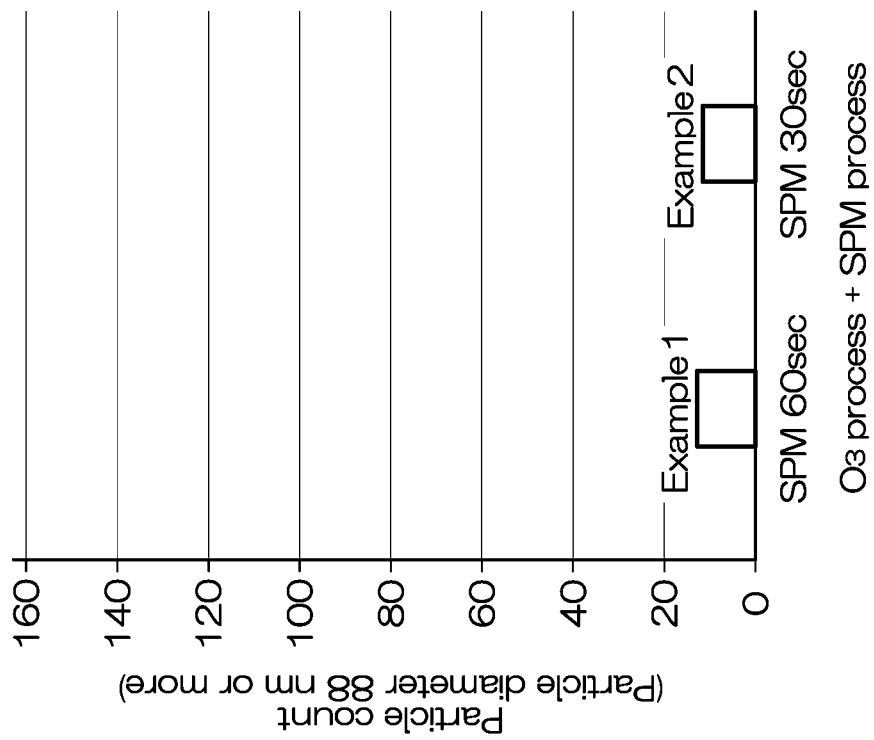
FIG. 9A and FIG. 9B are views each shown to describe an effect of a resist peeling-off process obtained by performing an ozone process and a high-temperature SPM process.
Figure 9A:
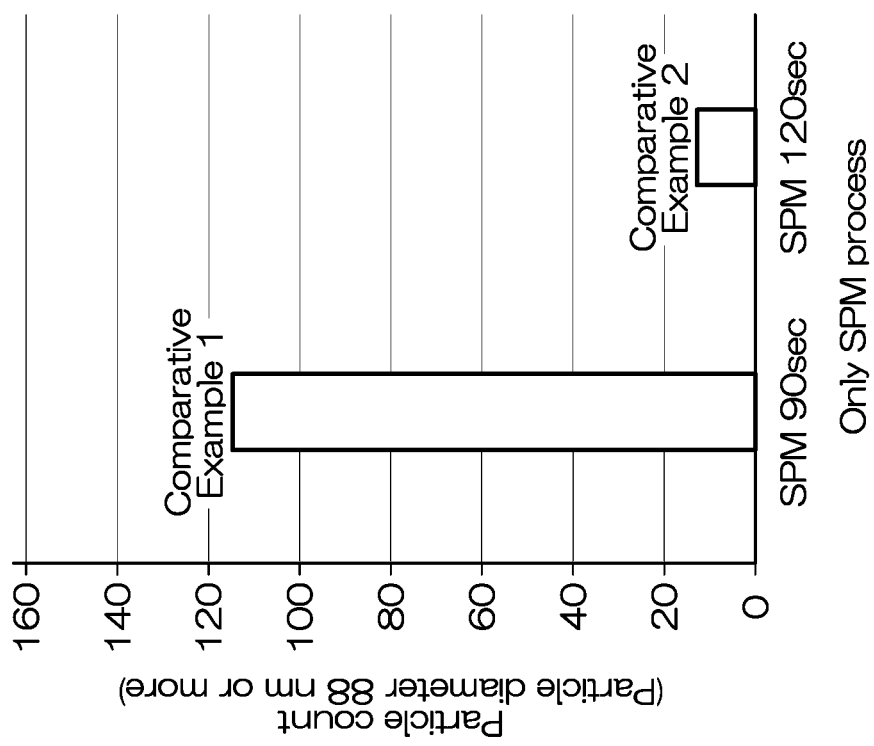

FIG. 9A and FIG. 9B are views each shown to describe an effect of a resist peeling-off process obtained by performing the ozone process and the high-temperature SPM process. In detail, a substrate, in which a resist has been formed on a front surface of a silicon wafer and to which a phosphorus ion implantation process has been applied under the condition that the energy is 10 keV and that the dose amount is $1 \times 10^{15}$ ions/cm$^2$, is set as a to-be-processed substrate.

As a comparative example in comparison with the thus formed substrate, FIG. 9A shows a result obtained by performing a resist removing process through only the high-temperature SPM process, i.e., without performing the ozone process. In Comparative Example 1, a high-temperature SPM was supplied for 90 seconds at a flow rate of 900 ml/minute, and then the number of foreign substances (whose particle size is 88 nm or more) on the substrate was counted by a particle counter. The result was 110 particles or more. In Comparative Example 2, a high-temperature SPM was supplied for 120 seconds at the same flow rate (900 ml/minute), and then the number of foreign substances (whose particle size is 88 nm or more) on the substrate was counted by the particle counter. The result was about 10 particles.

On the other hand, as Example 1, FIG. 9B shows a result obtained by performing a resist removing process by the ozone process and the high-temperature SPM process subsequent to the ozone process with respect to a substrate such as the one aforementioned. The ozone process was performed under the condition that the substrate temperature is 170° C. and that the processing time is 30 seconds. After finishing the ozone process, a high-temperature SPM was supplied for 60 seconds at a flow rate of 900 ml/minute, and then the number of foreign substances (whose particle size is 88 nm or more) on the substrate was counted by the particle counter. The result obtained thereby was about 10 particles. In Example 2, after finishing the ozone process in the same way as in Example 1, a high-temperature SPM was supplied for 30 seconds at a flow rate of 900 ml/minute, and then the number of foreign substances (whose particle size is 88 nm or more) on the substrate was counted by the particle counter. The result obtained thereby was about 10 particles. Therefore, a period of about 30 seconds was enough to set the processing time using the high-temperature SPM, and hence substantially the same result was obtained as in a case in which the high-temperature SPM process is performed for 120 seconds.

Figure 10A:
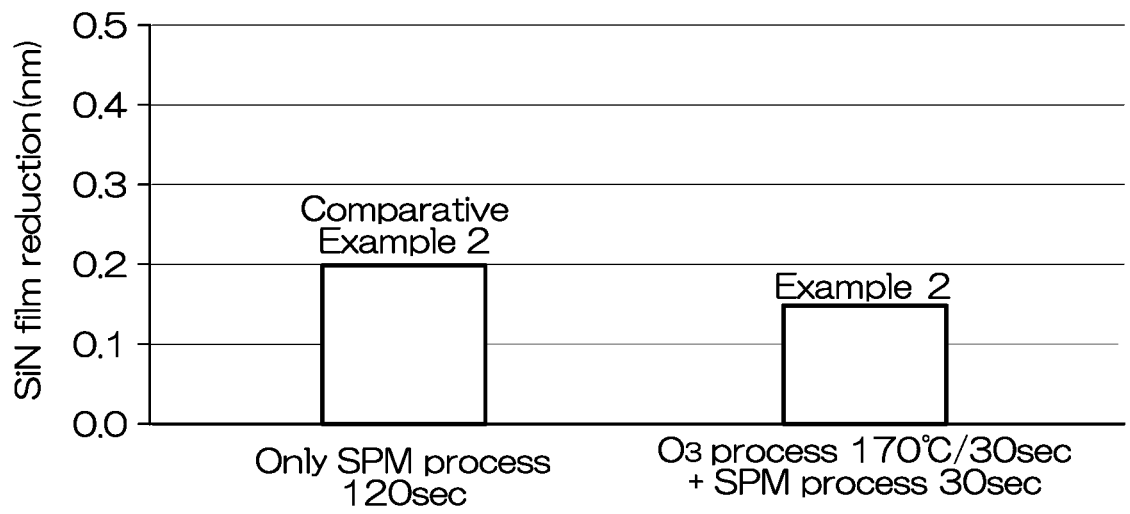
FIG. 10A and FIG. 10B show experimental results obtained by examining the influence of the processes on a substrate.
Figure 10B:
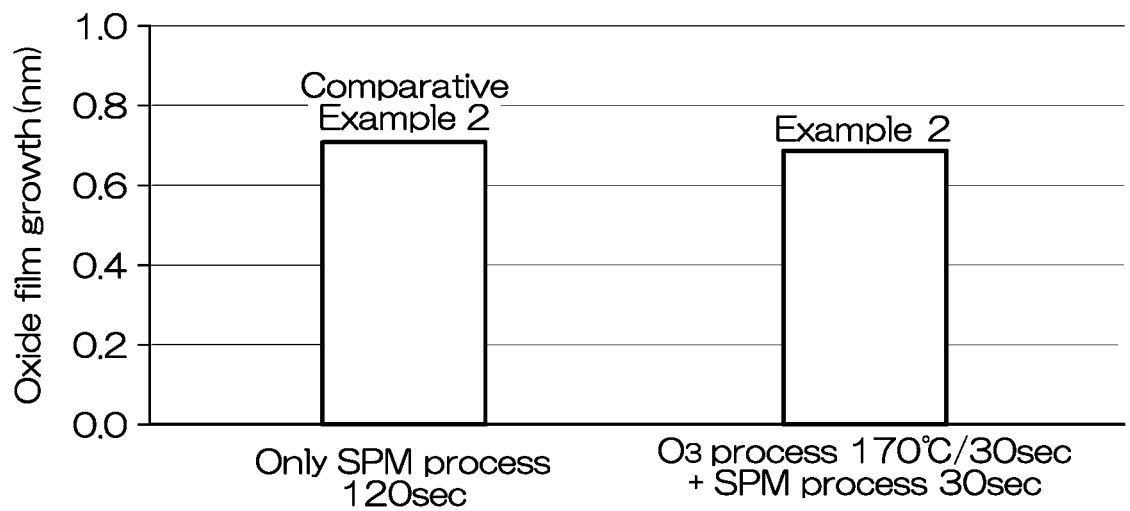

FIG. 10A and FIG. 10B show experimental results obtained by examining the influence of the processes on the substrate.

FIG. 10A shows a result obtained such that the process of Comparative Example 2 (high-temperature SPM process for 120 seconds) and the process of Example 2 (ozone process and high-temperature SPM process for 30 seconds) are applied onto a substrate (silicon wafer) having a front surface on which a SiN film is formed, and a film reduction of SiN (decrease in film thickness) is measured. It is understood that a film reduction is smaller, and an influence on the SiN film is smaller in the process of Example 2 than in the process of Comparative Example 2.

FIG. 10B shows a result obtained such that the aforementioned process of Comparative Example 2 (high-temperature SPM process for 120 seconds) and the aforementioned process of Example 2 (ozone process and high-temperature SPM process for 30 seconds) are applied onto a bare silicon wafer and the growth of an oxide film is measured. It is understood that the growth of the oxide film is attained at substantially the same level between Comparative Example 2 and Embodiment 2.

As thus described, the resist removing process in which the high-temperature SPM process is performed subsequently to the ozone process is not inferior in influence on the substrate to the resist removing process in which only the high-temperature SPM process is performed.

As described above, according to the present preferred embodiment, the hardened-layer removing step is performed in which a hardened layer of a resist surface layer is removed by the ozone process in which an ozone gas having a temperature of less than 150° C. is supplied to the front surface of the substrate W in a state in which the substrate W has been heated to 150° C. or more. After removing the hardened layer, the wet processing step is performed in which a high-temperature SPM is supplied to the front surface of the substrate W, and therefore the high-temperature SPM easily enters a non-hardened layer (bulk resist layer) between the hardened layer and the front surface of the substrate W, and peels off the resist from the front surface of the substrate W in a short time. Hence, the liquid processing time by use of SPM is shortened, and therefore productivity is improved. Additionally, it is possible to reduce an amount of SPM consumption, particularly, an amount of consumption of a sulfuric acid that is used as its raw material. This makes it possible to reduce an environmental burden. As described above, from the viewpoint of both a film reduction of SiN and the growth of an oxide film, the present preferred embodiment is less disadvantageous than a process in which a resist having a hardened layer is removed by liquid processing that exclusively uses a high-temperature SPM without performing the ozone process, and processing quality with respect to the substrate is not deteriorated. In other words, it is possible to realize a process equal to the resist peel-off process performed by only the liquid processing by use of SPM in a short time while reducing an amount of consumption of SPM (particularly, sulfuric acid).

In the present preferred embodiment, the hot plate 30 that heats a substrate W is placed in the thermal processing chamber 34 that can be sealed by closing the lid 36, and an ozone gas having a temperature of less than 150° C. is introduced into the thermal processing chamber 34. Therefore, the ozone gas reaches the vicinity of the front surface of the substrate W heated to 150° C. or more, and then is thermally decomposed, and therefore it is possible to allow an oxygen radical generated by thermal decomposition to reliably act on a hardened layer of a resist. Therefore, it is possible to efficiently remove the hardened layer.

On the other hand, in the present preferred embodiment, a high-temperature inert gas heated to 150° C. or more is introduced into the thermal processing chamber 34 after finishing the hardened-layer removing step employing the ozone process. As a result, ozone existing in the thermal processing chamber 34 is swiftly thermally decomposed. This makes it possible to swiftly render an atmosphere in the thermal processing chamber 34 harmless, hence making it possible to swiftly take out an already-processed substrate W. Therefore, it is possible to shorten a time required for the ozone process and to contribute to productivity improvement.

Although a room-temperature inert gas is introduced into the thermal processing chamber 34 before opening the lid 36 of the thermal processing chamber 34, this is performed not for the purpose of replacing an ozone gas in the thermal processing chamber 34 with another but for the purpose of cooling the thermal processing chamber 34 (particularly, its inner atmosphere). Therefore, a short time is enough to supply the inert gas. Additionally, it is possible to swiftly cool the thermal processing chamber 34 by supplying the inert gas for a short time, and therefore it is possible to shorten a period of time required until a substrate W is taken out. In accordance with this, it is possible to shorten a processing time, and therefore it is possible to contribute to productivity improvement.

If the high-temperature inert gas supplying step is omitted, it is suitable to supply a room-temperature inert gas to the thermal processing chamber 34, for example, for about 180 seconds in order to exclude ozone in the thermal processing chamber 34 by means of the room-temperature inert gas.

Although the preferred embodiment of the present invention has been described as above, the present invention can be embodied in yet other modes.

For example, as described in the above preferred embodiment, the dry process in which the ozone process is performed and the wet process in which SPM is supplied are performed in mutually different processing units (i.e., in mutually different chambers). However, the ozone process and the wet process in which SPM is supplied may be performed in the same processing unit (in the same chamber). However, there is a necessity to adjust an environment in the chamber when switching is performed between the dry process (ozone process) and the wet process, and therefore, if the dry process and the wet process are performed in mutually different chambers, the substrate can be efficiently processed, and therefore it is preferable to be performed in this way.

Additionally, as described in the above preferred embodiment, SPM that is a processing liquid including a sulfuric acid is mentioned as an example of a resist peel-off liquid. However, a sulfuric-acid ozone liquid in which ozone is mixed with a sulfuric acid, a hydrofluoric-acid/sulfuric-acid/hydrogen peroxide mixture in which a hydrofluoric acid is added to sulfuric-acid hydrogen peroxide water, only sulfuric acid, etc., can be mentioned as other examples of the resist peel-off liquid.

Although the preferred embodiments of the present invention have been described in detail, these preferred embodiments are merely specific examples used to clarify the technical contents of the present invention, and the present invention should not be understood by being limited to these specific examples, and the scope of the present invention is limited solely by the appended claims.

What is claimed is:

1. A substrate processing method of removing a resist that has a hardened layer from a front surface of a substrate, the substrate processing method comprising:
   a hardened-layer removing step of removing the hardened layer by generating an oxygen radical near the front surface of the substrate, the hardened-layer removing step including a heating step of heating the substrate to 150° C. or more and an ozone-gas supplying step of supplying an ozone gas to the front surface of the substrate being heated by the heating step; and
   a wet processing step of removing the resist from the front surface of the substrate by supplying a processing liquid including a sulfuric acid to the front surface of the substrate after the hardened-layer removing step, wherein
   the heating step is performed by placing the substrate on a hot plate disposed in a thermal processing chamber, and
   the ozone-gas supplying step is performed by introducing the ozone gas into the thermal processing chamber,
   the substrate processing method further comprising a high-temperature inert gas supplying step of introducing an inert gas having a temperature of 150° C. or more into the thermal processing chamber after finishing the hardened-layer removing step by stopping the ozone-gas supplying step, and a room-temperature-inert-gas supplying step of introducing a room-temperature inert gas into the thermal processing chamber after the high-temperature inert gas supplying step.

2. A substrate processing method of removing a resist that has a hardened layer from a front surface of a substrate, the substrate processing method comprising:
   a hardened-layer removing step of removing the hardened layer by generating an oxygen radical near the front surface of the substrate, the hardened-layer removing step including a heating step of heating the substrate to 150° C. or more and an ozone-gas supplying step of supplying an ozone gas to the front surface of the substrate being heated by the heating step; and
   a wet processing step of removing the resist from the front surface of the substrate by supplying a processing liquid including a sulfuric acid to the front surface of the substrate after the hardened-layer removing step, wherein
   the heating step is performed by placing the substrate on a hot plate disposed in a thermal processing chamber, and
   the ozone-gas supplying step is performed by introducing the ozone gas into the thermal processing chamber,
   the substrate processing method further comprising a high-temperature inert gas supplying step of introducing an inert gas having a temperature of 150° C. or more into the thermal processing chamber after finishing the hardened-layer removing step by stopping the ozone-gas supplying step, wherein the thermal processing chamber is sealed in the high-temperature inert gas supplying step so as to retain the ozone gas and the inert gas in the thermal processing chamber, and the retained ozone gas is thermally decomposed and rendered harmless.

3. The substrate processing method according to claim 2, further comprising a room-temperature-inert-gas supplying step of introducing a room-temperature inert gas into the thermal processing chamber after the high-temperature inert gas supplying step.

4. The substrate processing method according to claim 1, wherein the ozone-gas supplying step supplies an ozone gas having a temperature of less than 150° C. to the front surface of the substrate.

* * * * *